(12) United States Patent
Sakashita et al.

(10) Patent No.: US 11,069,615 B2
(45) Date of Patent: Jul. 20, 2021

(54) INDUCTOR, FILTER, AND MULTIPLEXER

(71) Applicant: TAIYO YUDEN CO., LTD., Tokyo (JP)

(72) Inventors: Takeshi Sakashita, Tokyo (JP); Takashi Matsuda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/655,994

(22) Filed: Oct. 17, 2019

(65) Prior Publication Data

US 2020/0161238 A1 May 21, 2020

(30) Foreign Application Priority Data

Nov. 20, 2018 (JP) .............................. JP2018-217341

(51) Int. Cl.

| | |
|---|---|
| *H01L 23/522* | (2006.01) |
| *H05K 1/02* | (2006.01) |
| *H03H 7/09* | (2006.01) |
| *H01F 27/28* | (2006.01) |
| *H01F 27/40* | (2006.01) |
| *H01F 17/00* | (2006.01) |

(52) U.S. Cl.
CPC ..... *H01L 23/5227* (2013.01); *H01F 17/0013* (2013.01); *H01F 27/28* (2013.01); *H01F 27/40* (2013.01); *H03H 7/09* (2013.01); *H05K 1/0233* (2013.01)

(58) Field of Classification Search
CPC . H01L 23/5227; H01F 17/0013; H01F 27/28; H01F 27/40; H05K 1/0233

USPC ......................................................... 257/531
See application file for complete search history.

(56) References Cited

U.S. PATENT DOCUMENTS

| | | | | |
|---|---|---|---|---|
| 2003/0042569 | A1* | 3/2003 | Ahn ...................... | H01F 41/043 257/528 |
| 2004/0070481 | A1* | 4/2004 | Patel ................... | H01F 27/2804 336/200 |
| 2006/0114077 | A1* | 6/2006 | Mizuno ................... | H01L 21/84 333/33 |

(Continued)

FOREIGN PATENT DOCUMENTS

| | | |
|---|---|---|
| CN | 108023568 A | 5/2018 |
| CN | 101447277 A | 6/2020 |

(Continued)

*Primary Examiner* — Dzung Tran
(74) *Attorney, Agent, or Firm* — Stein IP, LLC

(57) ABSTRACT

An inductor includes: a substrate; a first wiring line located on the substrate; a second wiring line located above the first wiring line and spaced from the first wiring line through an air gap, at least a part of the second wiring line overlapping with at least a part of the first wiring line in plan view; a first supporting post connecting ends of the first and second wiring lines such that a direct current conducts between the first and second wiring lines through the first supporting post; and a second supporting post provided such that the second supporting post overlaps with the second wiring line in plan view, and overlaps with the first wiring line in plan view or is surrounded by the first wiring line in plan view, the second supporting post being insulated from the first wiring line, the second supporting post supporting the second wiring line.

17 Claims, 13 Drawing Sheets

(56) References Cited

U.S. PATENT DOCUMENTS

| | | | |
|---|---|---|---|
| 2007/0045773 A1* | 3/2007 | Mi | H01L 27/0688 257/531 |
| 2007/0102784 A1 | 5/2007 | Matsumoto et al. | 257/528 |
| 2007/0122992 A1* | 5/2007 | Mizuno | H05K 1/162 438/396 |
| 2007/0158848 A1 | 7/2007 | Matsumoto et al. | 257/758 |
| 2008/0048816 A1 | 2/2008 | Matsumoto et al. | 336/200 |
| 2008/0055873 A1 | 3/2008 | Mi et al. | 361/761 |
| 2009/0085707 A1 | 4/2009 | Mi et al. | 336/200 |
| 2009/0085708 A1 | 4/2009 | Matsumoto et al. | 336/200 |
| 2009/0166068 A1 | 7/2009 | Takahashi et al. | 174/258 |
| 2009/0170032 A1 | 7/2009 | Takahashi et al. | 430/312 |
| 2009/0213561 A1 | 8/2009 | Mi et al. | 361/782 |
| 2009/0219670 A1 | 9/2009 | Takahashi et al. | 361/311 |
| 2009/0237894 A1 | 9/2009 | Ueda et al. | 361/748 |
| 2009/0297785 A1 | 12/2009 | Ueda et al. | 428/172 |
| 2017/0032882 A1* | 2/2017 | Yang | H01F 41/042 |
| 2017/0294262 A1 | 10/2017 | Lee et al. | H01F 27/0804 |
| 2017/0331457 A1* | 11/2017 | Satoh | H03H 9/605 |
| 2018/0123547 A1 | 5/2018 | Kato et al. | H03H 7/0161 |
| 2018/0315545 A1 | 11/2018 | Kusumoto et al. | |

FOREIGN PATENT DOCUMENTS

| | | |
|---|---|---|
| JP | H 5-23513 U | 3/1993 |
| JP | 2003-282325 A | 10/2003 |
| JP | 2006-157738 A | 6/2006 |
| JP | 2007-67236 A | 3/2007 |
| JP | 2007-134380 A | 5/2007 |
| JP | 2007-149827 A | 6/2007 |
| JP | 2007-173437 A | 7/2007 |
| JP | 2008-53613 A | 3/2008 |
| JP | 2008-60342 A | 3/2008 |
| JP | 2008-205513 A | 9/2008 |
| JP | 2009-88161 A | 4/2009 |
| JP | 2009-88162 A | 4/2009 |
| JP | 2009-88163 A | 4/2009 |
| JP | 2009-146996 A | 7/2009 |
| JP | 2009-164219 A | 7/2009 |
| JP | 2009-164220 A | 7/2009 |
| JP | 2009-164221 A | 7/2009 |
| JP | 2009-206208 A | 9/2009 |
| JP | 2009-206371 A | 9/2009 |
| JP | 2009-295624 A | 12/2009 |
| JP | 2017-191931 A | 10/2017 |
| KR | 10-2018-0071645 A | 6/2018 |

* cited by examiner

INDUCTOR, FILTER, AND MULTIPLEXER

CROSS-REFERENCE TO RELATED APPLICATION

This application is based upon and claims the benefit of priority of the prior Japanese Patent Application No. 2018-217341, filed on Nov. 20, 2018, the entire contents of which are incorporated herein by reference.

FIELD

A certain aspect of the present invention relates to an inductor, a filter, and a multiplexer.

BACKGROUND

The inductor is used for phase matching in radio frequency (RF) systems such as, but not limited to, mobile phones and wireless local area networks (LANs). It has been known to form an inductor on a substrate as disclosed in Japanese Patent Application Publication Nos. 2006-157738, 2007-67236, and 2009-88163 (hereinafter, referred to as Patent Documents 1, 2, and 3, respectively). It has been known that a plurality of spiral coils are stacked with an air gap therebetween as disclosed in, for example, Patent Documents 2 and 3. It has been known to support an upper coil by a supporting post located outside the coil such that the upper coil is fixed to a substrate through the supporting post, as disclosed in, for example, Patent Document 3.

SUMMARY OF THE INVENTION

According to a first aspect of the present invention, there is provided an inductor including: a substrate; a first wiring line located on the substrate; a second wiring line located above the first wiring line and spaced from the first wiring line through an air gap, at least a part of the second wiring line overlapping with at least a part of the first wiring line in plan view; a first supporting post connecting an end of the first wiring line and an end of the second wiring line such that a direct current conducts between the first wiring line and the second wiring line through the first supporting post; and a second supporting post provided such that the second supporting post overlaps with the second wiring line in plan view, and overlaps with the first wiring line in plan view or is surrounded by the first wiring line in plan view, the second supporting post being insulated from the first wiring line, the second supporting post supporting the second wiring line.

According to a second aspect of the present invention, there is provided a filter including the above inductor.

According to a third aspect of the present invention, there is provided a multiplexer including the above inductor.

DETAILED DESCRIPTION

When a supporting post supports an upper coil such that the upper coil is fixed to a substrate through the supporting post, the mechanical strength and the impact resistance of the upper coil are enhanced. However, when the supporting post is located outside the coil, the inductor grows in size.

Hereinafter, with reference to the accompanying drawings, embodiments of the present disclosure will be described.

First Embodiment

Figure 1:
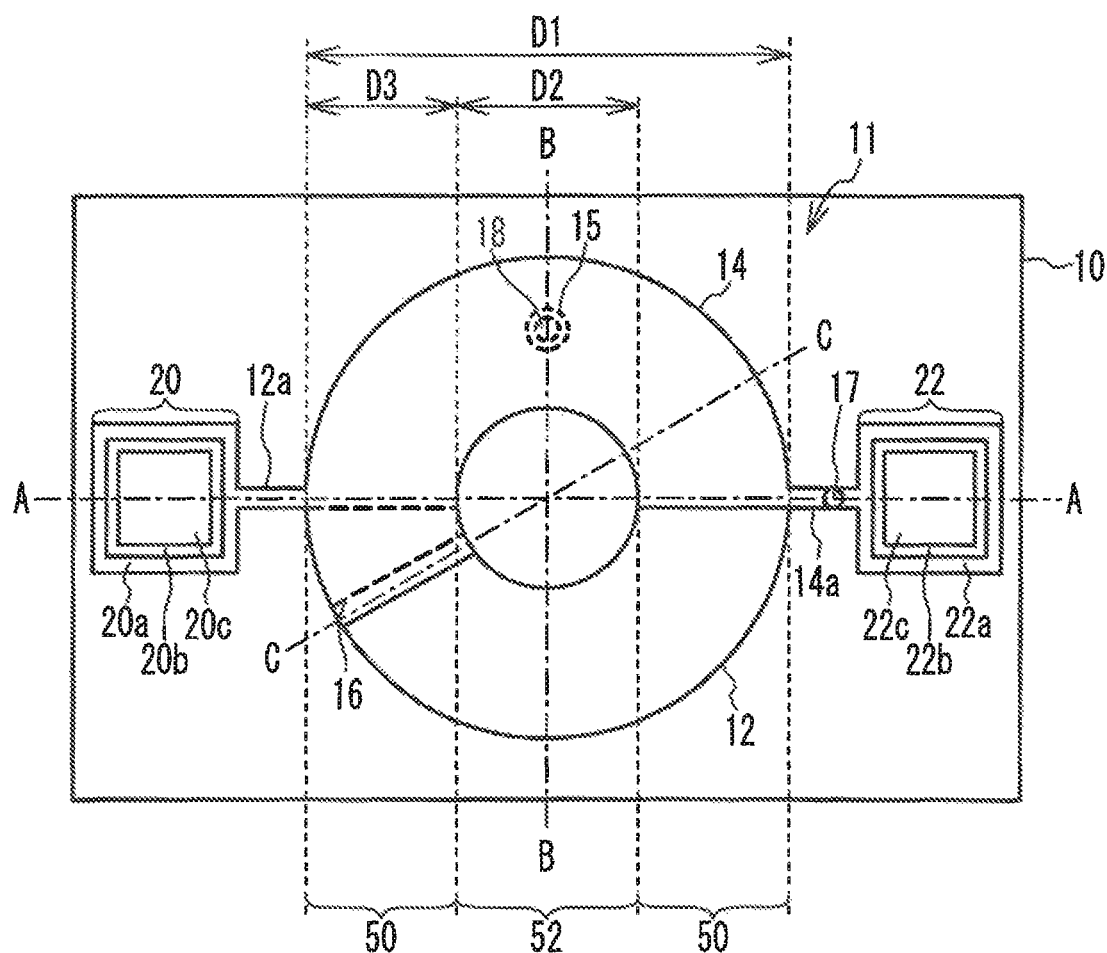
FIG. 1 is a plan view of an inductor in accordance with a first embodiment.
Figure 2A:
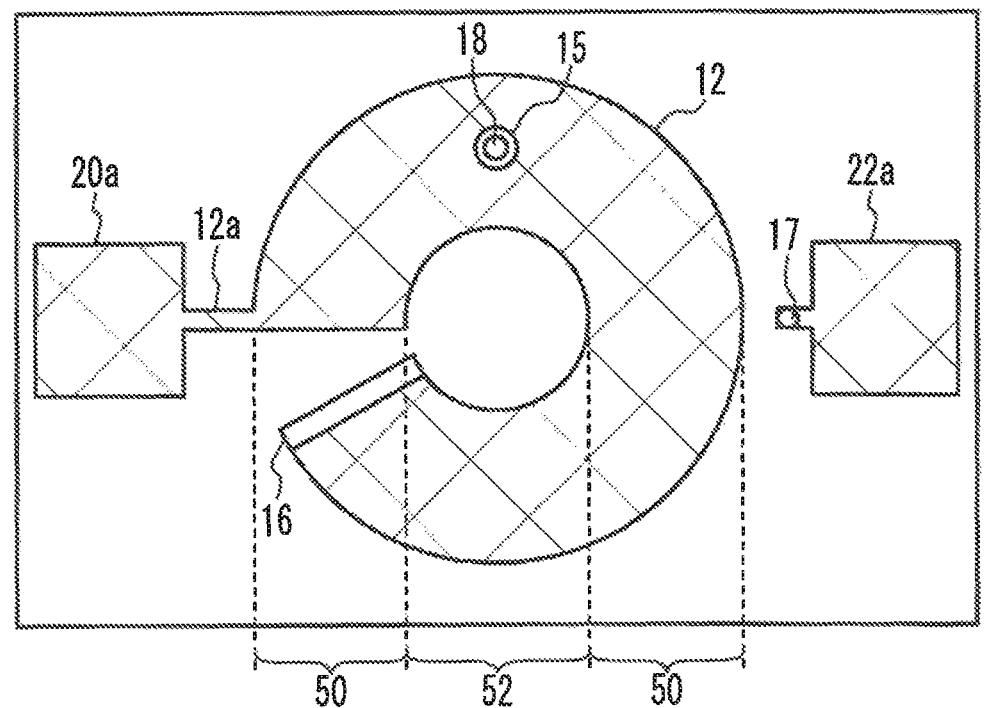
FIG. 2A and FIG. 2B are plan views of the inductor in accordance with the first embodiment.
Figure 2B:
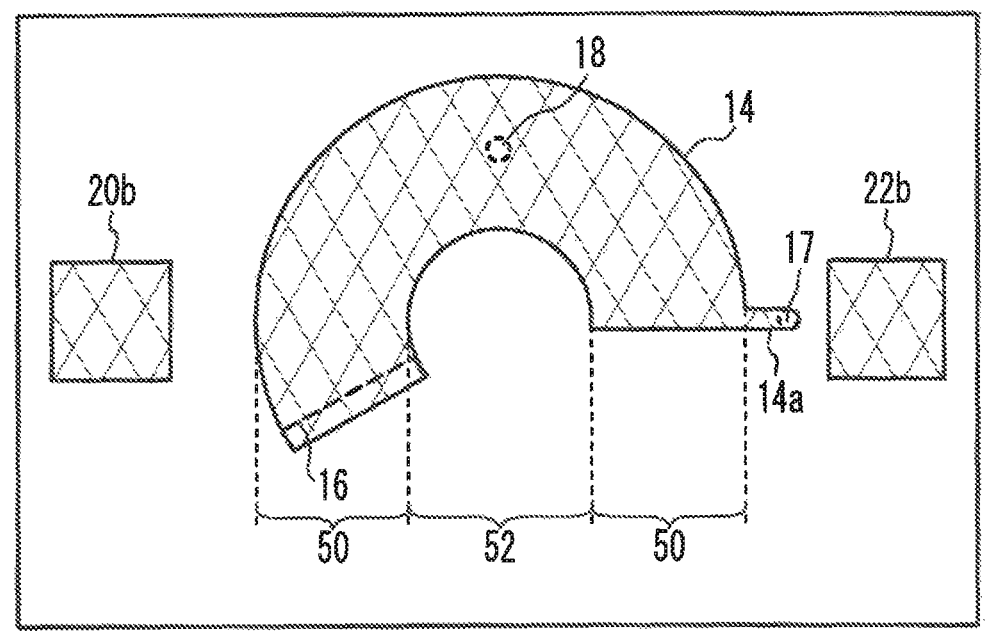
Figure 3A:
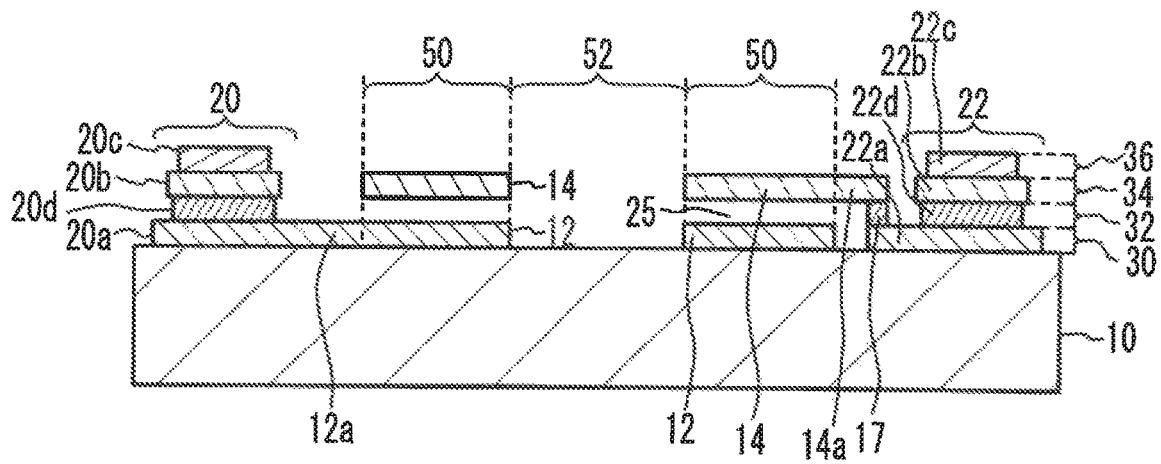
FIG. 3A is a cross-sectional view taken along line A-A in FIG. 1A.
Figure 3B:
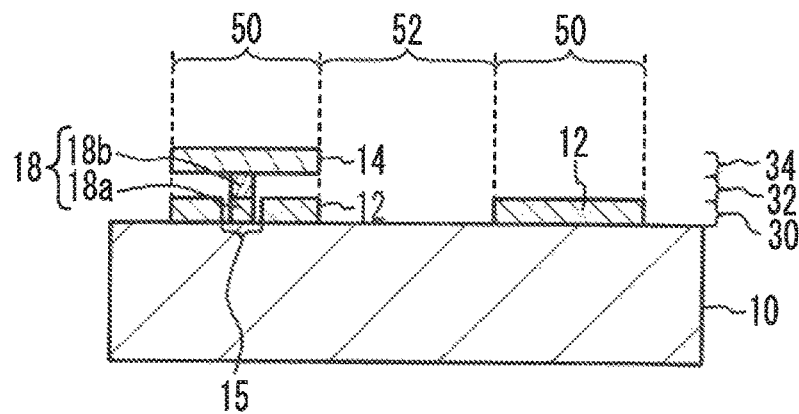
FIG. 3B is a cross-sectional view taken along line B-B in FIG. 1A.
Figure 3C:
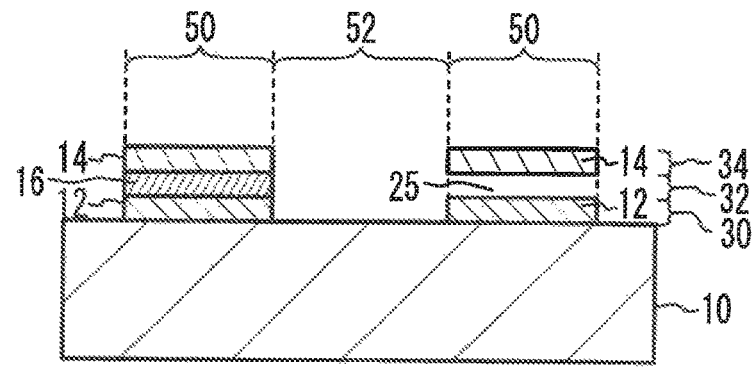
FIG. 3C is a cross-sectional view taken along line C-C in FIG. 1A.

FIG. 1 through FIG. 2B are plan views of an inductor in accordance with a first embodiment. FIG. 2A mainly illustrates a wiring line 12, and FIG. 2B mainly illustrates a wiring line 14. FIG. 3A is a cross-sectional view taken along line A-A in FIG. 1A, FIG. 3B is a cross-sectional view taken along line B-B in FIG. 1A, and FIG. 3C is a cross-sectional view taken along line C-C in FIG. 1A.

As illustrated in FIG. 1 through FIG. 3C, a coil 11 and pads 20 and 22 are located on a substrate 10. The coil 11 includes wiring lines 12 and 14. The wiring line 12 is located on the substrate 10. The wiring line 14 is located above the substrate 10 and the wiring line 12, and is spaced from the substrate 10 and the wiring line 12 through an air gap 25. A center region 52 and a winding region 50 surrounding the center region 52 are provided. None of the wiring lines 12 and 14 is located in the center region 52. The winding region 50 is a region obtained by adding the region where the wiring line 12 overlaps with the substrate 10 to the region where the wiring line 14 overlaps with the substrate 10. The wiring lines 12 and 14 are provided in the winding region 50 so as to wind around the center region 52. The number of turns of the wiring line 12 is slightly smaller than 1, and the number of turns of the wiring line 14 is slightly greater than 0.5. The total number of turns of the wiring lines 12 and 14 is approximately 1.5.

A supporting post 16 is in contact with the upper surface of a first end of the wiring line 12, and is in contact with the lower surface of a first end of the wiring line 14. Accordingly, the supporting post 16 electrically connects the first end of the wiring line 12 and the first end of the wiring line 14 (i.e., the supporting post 16 connects the first end of the wiring line 12 and the first end of the wiring line 14 such that a direct current can conduct between the wiring line 12 and the wiring line 14 through the supporting post 16). The supporting post 16 supports the wiring line 14 such that the wiring line 14 is fixed to the substrate 10 through the supporting post 16.

A second end of the wiring line 12 is extracted outward by an extraction wiring line 12a, and is electrically connected to the pad 20. A second end of the wiring line 14 is electrically connected to the pad 22 through an extraction wiring line 14a and a supporting post 17. The supporting post 17 is in contact with the lower surface of the extraction wiring line 14a and the upper surface of a metal layer 22a, and thereby, electrically connects the extraction wiring line 14a and the pad 22. The supporting post 17 supports the wiring line 14 such that the wiring line 14 is fixed to the substrate 10 through the supporting post 17.

Figure 4A:
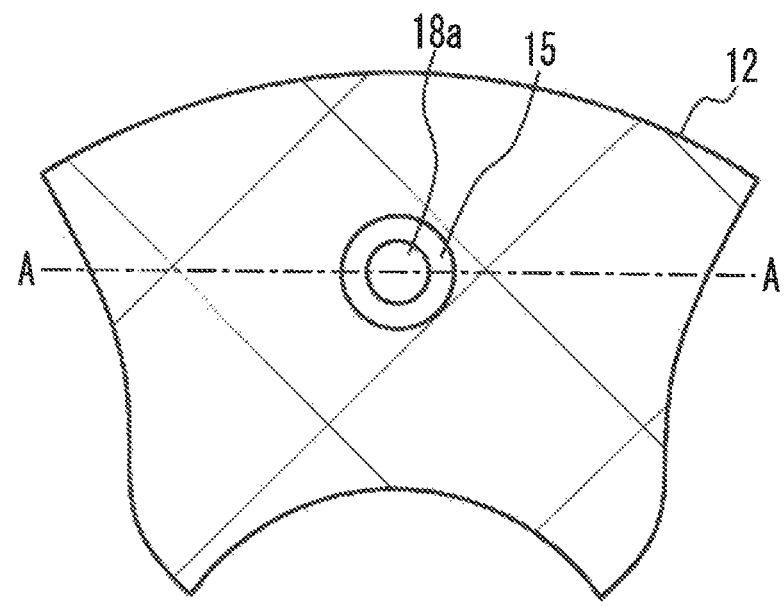
FIG. 4A is an enlarged view of a part around an opening 15 in the first embodiment.
Figure 4B:
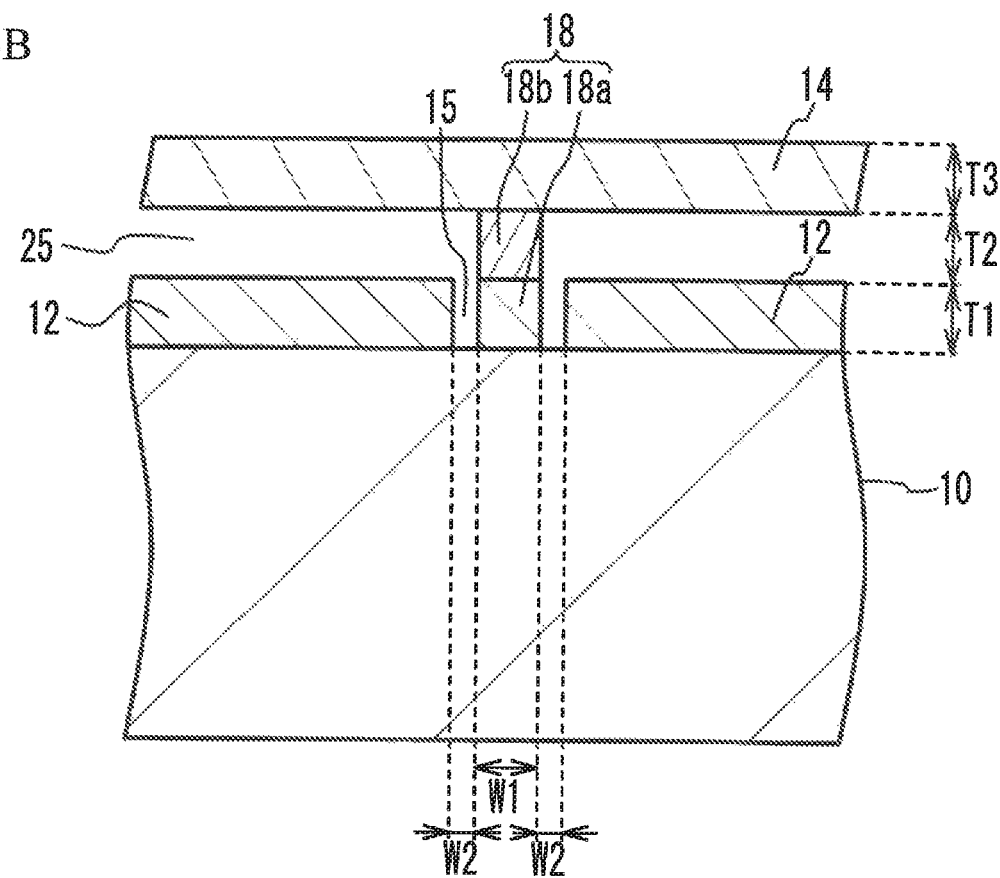
FIG. 4B is a cross-sectional view taken along line A-A in FIG. 4A.

FIG. 4A is an enlarged view of a part around an opening 15 in the first embodiment, and FIG. 4B is a cross-sectional view taken along line A-A in FIG. 4A. As illustrated in FIG. 4A and FIG. 4B, the planar shape of the opening 15 is a circular shape. The opening 15 is provided so as to be located within the wiring line 12 (i.e., the opening 15 is the region completely surrounded by the wiring line 12), and is the region where no wiring line 12 is formed. The planar shape of the opening 15 may be a polygonal shape such as a quadrangular shape, or may be an elliptical shape or an oval shape. The opening 15 is located in substantially the middle in the radical direction of the wiring line 12. The position of the opening 15 can be freely selected. A supporting post 18 is located in the center of the opening 15. The supporting post 18 includes a metal layer 18a located on the substrate 10, and a metal layer 18b located on the metal layer 18a. The upper surface of the metal layer 18b is in contact with the wiring line 14. The supporting post 18 and the wiring line 12 are spaced from each other through the air gap 25. Thus, the supporting post 18 electrically connects to the wiring line 14, but is insulated from the wiring line 12 (i.e., no direct current conducts between the wiring line 14 and the wiring line 12 through the supporting post 18). The supporting post 18 supports the wiring line 14 such that the wiring line 14 is fixed to the substrate 10 through the supporting post 18.

As illustrated in FIG. 3A through FIG. 3C, the pad 20 includes metal layers 20a through 20d that are stacked. The pad 22 includes metal layers 22a through 22d that are stacked.

The wiring line 12, the extraction wiring line 12a, and the metal layers 18a, 20a, and 22a are formed of a metal layer 30. The supporting posts 16 and 17 and the metal layers 18b, 20d, and 22d are formed of a metal layer 32. The wiring line 14, the extraction wiring line 14a, and the metal layers 20b and 22b are formed of a metal layer 34. The metal layers 20c and 22c are formed of a metal layer 36. The metal layers 30, 32, and 34 are, for example, copper layers, and are formed by, for example, plating. The metal layer 36 is, for example, a gold layer, and is a layer that a gold bump is in contact with.

The metal layers 30, 32, 34, and 36 are preferably layers mainly composed of a metal having a low resistance such as copper layers, gold layers, aluminum layers, or silver layers.

The metal layers 30, 32, 34, and 36 may be formed of a plurality of metal films that are stacked. The uppermost film and/or the lowermost film of the metal films may be an adhesion layer and/or a barrier layer. The adhesion layer and/or the barrier layer is a titanium layer, a chrome layer, a nickel layer, a molybdenum layer, a tantalum layer, or a tungsten layer made of a metal having a high melting point, or an alloy layer containing at least one of titanium, chrome, nickel, molybdenum, tantalum, and tungsten. The substrate 10 is preferably made of a material having a high insulation property, and is, for example, an insulating substrate such as, but not limited to, a quartz (including synthetic quarts) substrate, a glass (Pyrex (registered trademark), TEMPAX, aluminosilicate, borosilicate glass, or the like) substrate or a ceramic substrate, or a high-resistance silicon substrate. An insulating film may be located between the substrate 10 and the wiring line 12.

As illustrated in FIG. 1, the width of the coil 11 is represented by D1, the width of the center region 52 is represented by D2, and the widths of the wiring lines 12 and 14 are represented by D3. As illustrated in FIG. 4B, the thickness of the wiring line 12 is represented by T1, the thickness of the air gap 25 between the wiring lines 12 and 14 is represented by T2, and the thickness of the wiring line 14 is represented by T3. The width of the supporting post 18 is represented by W1, and the interval between the supporting post 18 and the wiring line 12 is represented by W2. D1 is, for example, 100 μm to 2000 μm, D2 is, for example, 10 μm to 1000 μm, and D3 is, for example, 10 μm to 500 μm. Each of T1 through T3 is, for example, 1 μm to 50 μm. Each of W1 and W2 is, for example, 1 μm to 50 μm.

First Variation of the First Embodiment

Figure 5:
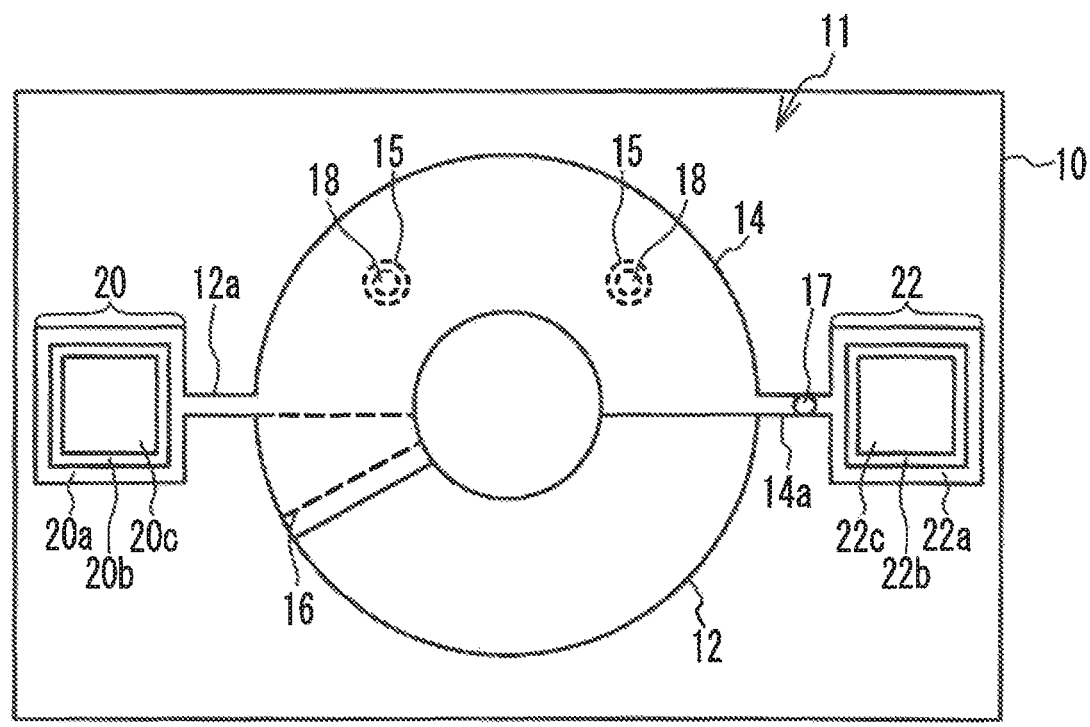
FIG. 5 is a plan view of an inductor in accordance with a first variation of the first embodiment.

FIG. 5 is a plan view of an inductor in accordance with a first variation of the first embodiment. As illustrated in FIG. 5, two openings 15 and two supporting posts 18 are provided. The locations where the opening 15 and the supporting post 18 are provided are located in positions that divide the part between the first end and the second end of the wiring line 14 into substantially three equal parts, and are located in substantially the middle in the radial direction of the wiring line 14. Other structures are the same as those of the first embodiment, and the description thereof is thus omitted. As described in the first variation of the first embodiment, provision of a plurality of the supporting posts 18 further mechanically reinforces the wiring line 14.

First Comparative Example

Figure 6:
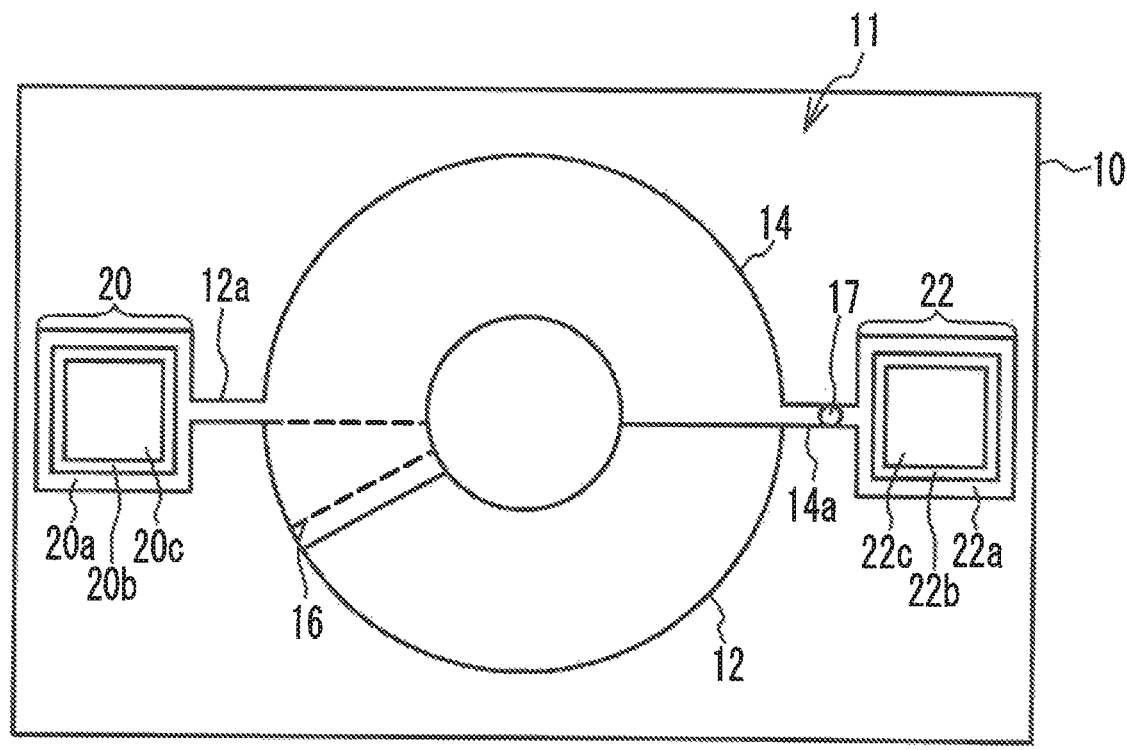
FIG. 6 is a plan view of an inductor in accordance with a first comparative example.

FIG. 6 is a plan view of an inductor in accordance with a first comparative example. As illustrated in FIG. 6, in the first comparative example, no opening 15 and no supporting post 18 are provided. Other structures are the same as those of the first embodiment, and the description thereof is thus omitted. In the first comparative example, the wiring line 14 is supported only by the supporting posts 16 and 17. Thus, compared with the first embodiment, the mechanical strength of the wiring line 14 is small.

Figure 7A:
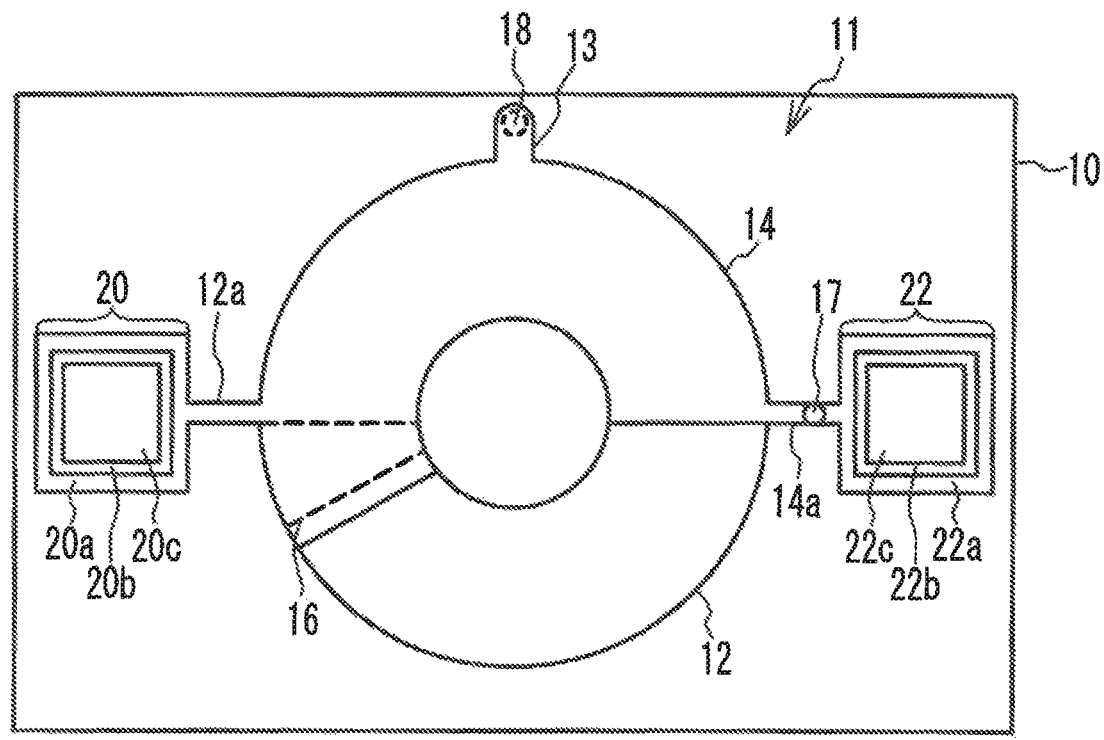
FIG. 7A and FIG. 7B are plan views of inductors in accordance with a second comparative example and a first variation of the second comparative example, respectively.
Figure 7B:
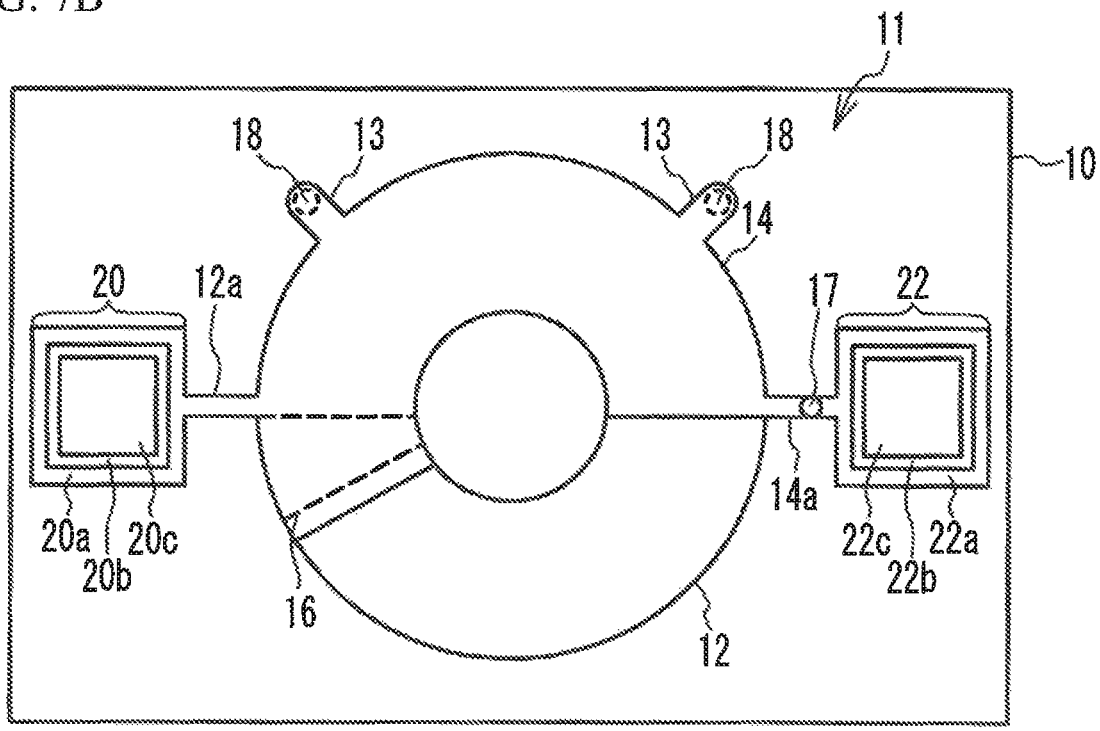

Second Comparative Example and First Variation of the Second Comparative Example FIG. 7A and FIG. 7B are plan views of inductors in accordance with a second comparative example and a first variation thereof, respectively. As illustrated in FIG. 7A, in the second comparative example, one extraction portion 13 is located further out than the outer periphery of the wiring line 14. The supporting post 18 is provided in the extraction portion 13. No opening 15 is provided within the wiring line 14. Other structures are the same as those of the first embodiment, and the description thereof is thus omitted.

As illustrated in FIG. 7B, in the first variation of the second comparative example, two extraction portions 13 are provided further out than the outer periphery of the wiring line 14. The supporting posts 18 are provided in the extraction portions 13. Other structures are the same as those of the second comparative example, and the description thereof is thus omitted.

Third Comparative Example and First Variation of the Third Comparative Example

Figure 8A:
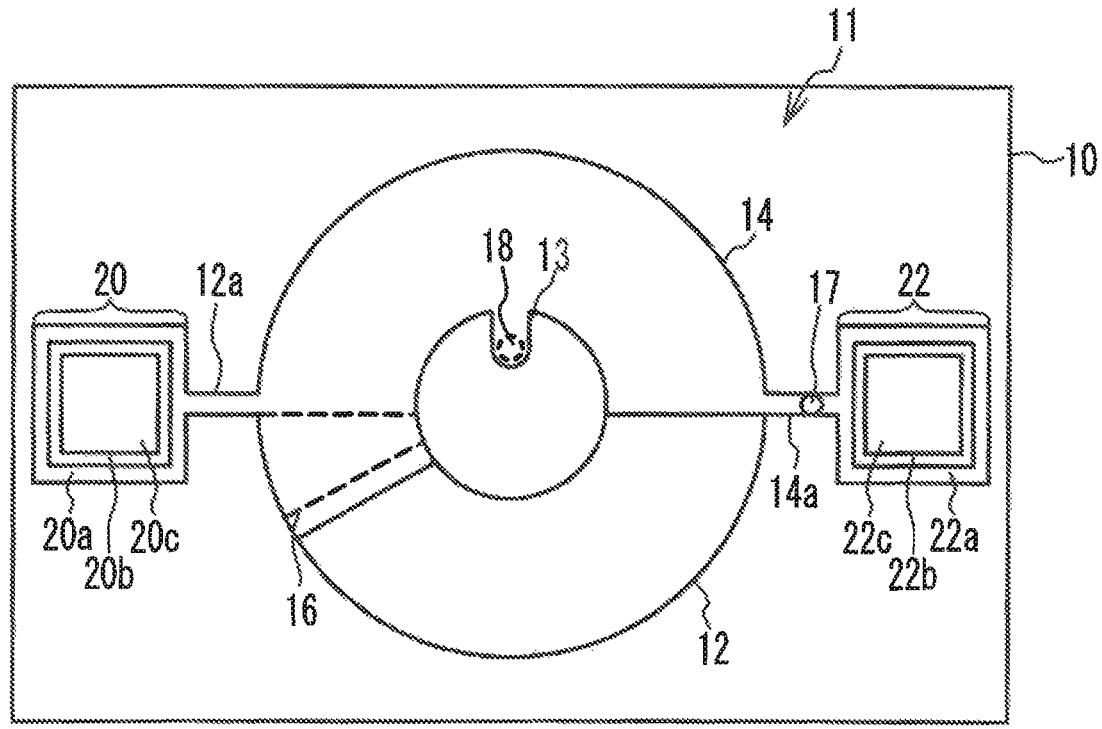
FIG. 8A and FIG. 8B are plan views of inductors in accordance with a third comparative example and a first variation of the third comparative example, respectively.
Figure 8B:
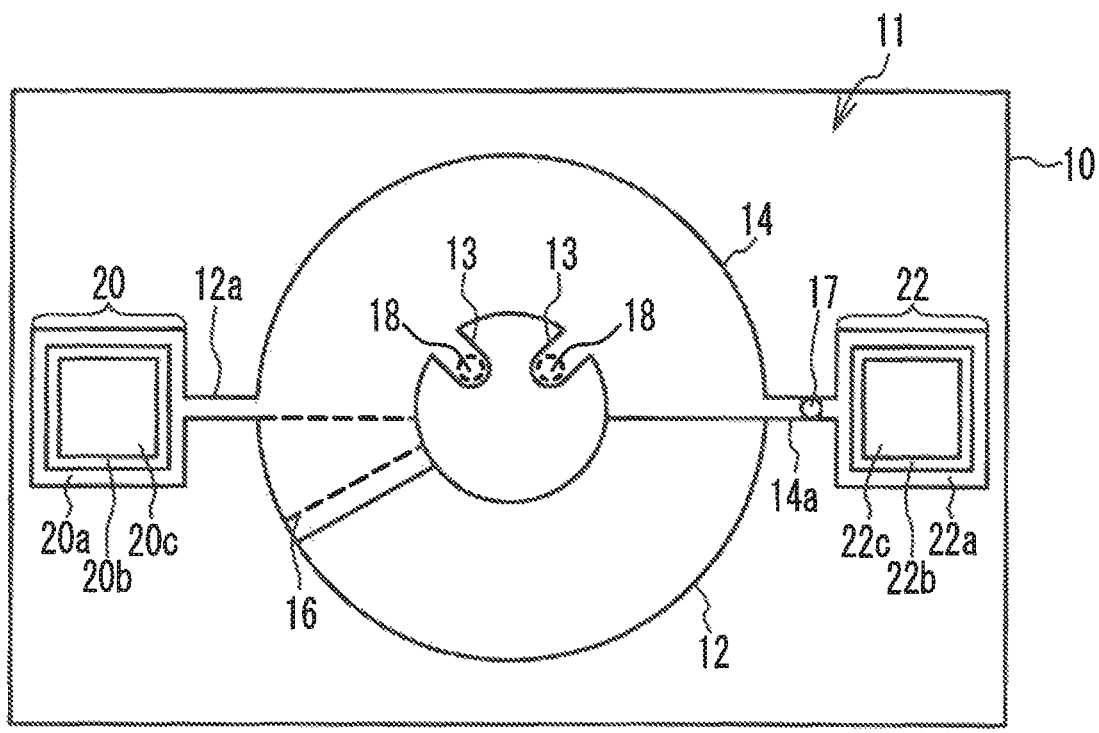

FIG. 8A and FIG. 8B are plan views of inductors in accordance with a third comparative example and a first variation thereof, respectively. As illustrated in FIG. 8A, in the third comparative example, one extraction portion 13 is located further in than the inner periphery of the wiring line 14. The supporting post 18 is provided in the extraction portion 13. No opening 15 is located within the wiring line 14. Other structures are the same as those of the first embodiment, and the description thereof is thus omitted.

As illustrated in FIG. 8B, in the first variation of the third comparative example, two extraction portions 13 are located further in than the inner periphery of the wiring line 14. The supporting post 18 is located in the extraction portion 13. Other structures are the same as those of the third comparative example, and the description thereof is thus omitted.

Simulation

For the first embodiment and the comparative examples, the Q-value of the inductor was subjected to electromagnetic field simulation. The simulation conditions are as follows.

Figure 9:
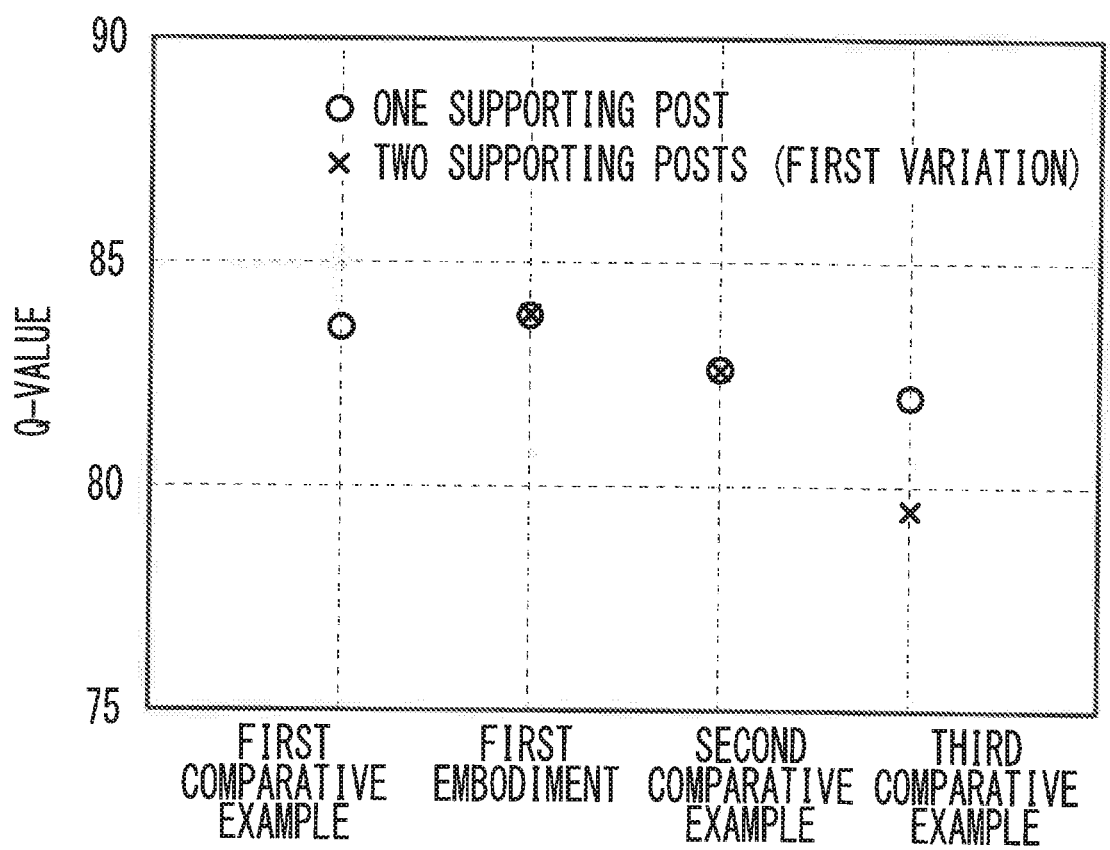
FIG. 9 illustrates results of a simulation.

Metal layers 30, 32, and 34: Copper layer
Substrate 10: Glass substrate
D1: 800 μm
D2: 300 μm
D3: 250 μm
T1, T2, T3, W1, and W2: 30 μm
Number of turns: 1.5
Frequency: 3 GHz FIG. 9 illustrates the results of the simulation. Open circles represent the first embodiment and the second and third comparative examples, in which one supporting post 18 is provided, and the first comparative examples in which no supporting post 18 is provided. X-marks represent the first variation of each of the first embodiment and the second and third comparative examples, in which two supporting posts 18 are provided.

As illustrated in FIG. 9, regardless of the number of the supporting posts 18, the Q-value of the first embodiment is substantially equal to the Q-value of the first comparative example in which no supporting post 18 is provided. The Q-value of the second comparative example in which one supporting post 18 is provided further out than the outer periphery of the wiring line 14 is smaller than those of the first comparative example and the first embodiment. The Q-value of the third comparative example in which one supporting post 18 is provided further in than the inner periphery of the wiring line 14 is further smaller than the Q-value of the second comparative example. When two supporting posts 18 are provided as in the first variation of the third comparative example, the Q-value further decreases.

In the first comparative example, the Q-value is high, but no supporting post 18 is provided, Thus, the mechanical strength and/or the impact resistance of the wiring line 14 is low. In the second comparative example and the first variation thereof, provision of the supporting post 18 enhances the mechanical strength and/or the impact resistance of the wiring line 14. However, the Q-value is smaller than those of the first embodiment and the first comparative example. This is considered because the eddy-current loss due to the extraction portion 13 and the supporting post 18 increases since the extraction portion 13 and the supporting post 18 are provided in the outside of the wiring line 14 in which a magnetic flux density is large (in the outside of the coil 11). In addition, since the supporting post 18 is located further out than the outer periphery of the wiring line 14, the inductor grows in size.

In the third comparative example and the first variation thereof, the supporting post 18 is provided further in than the inner periphery of the wiring line 14. Thus, the inductor is reduced in size, and the mechanical strength and/or the impact resistance of the wiring line 14 is enhanced. However, the Q-value is less than those of the first embodiment and the first and second comparative examples. This is considered because the eddy-current loss increases because of the extraction portion 13 and the supporting post 18 since the extraction portion 13 and the supporting post 18 are provided in the center region 52 of which the magnetic flux density is larger than the magnetic flux density in the outside of the wiring line 14 (in the outside of the coil 11).

In the first embodiment and the first variation thereof, the supporting post 18 is provided so as to overlap with the wiring line 14 (i.e., the supporting post 18 is provided in the winding region 50). Since the magnetic flux density is small in the winding region 50, the eddy-current loss due to the supporting post 18 is small. Thus, the Q-value can be made to be approximately equal to that of the first comparative example. In addition, the increase in size of the inductor due to the provision of the supporting post 18 is inhibited, and the inductor is reduced in size. Furthermore, the provision of the supporting post 18 enhances the mechanical strength and/or the impact resistance compared with the first comparative example.

Second Variation of the First Embodiment

Figure 10A:
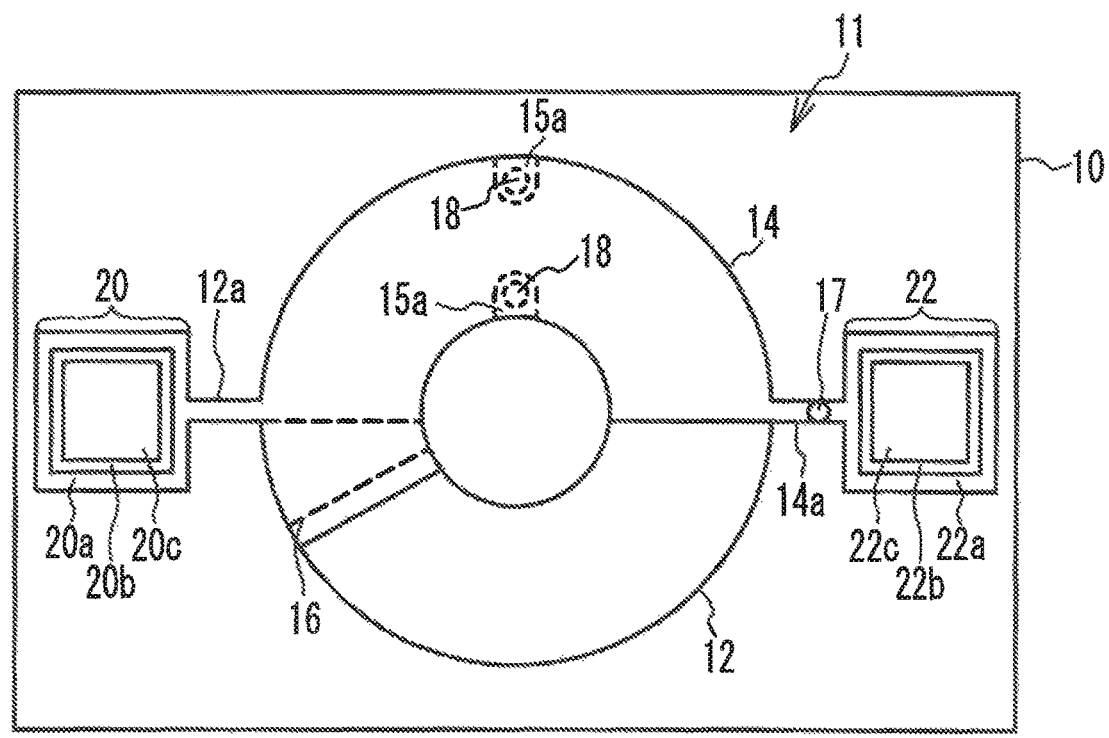
FIG. 10A is a plan view of an inductor in accordance with a second variation of the first embodiment.
Figure 10B:
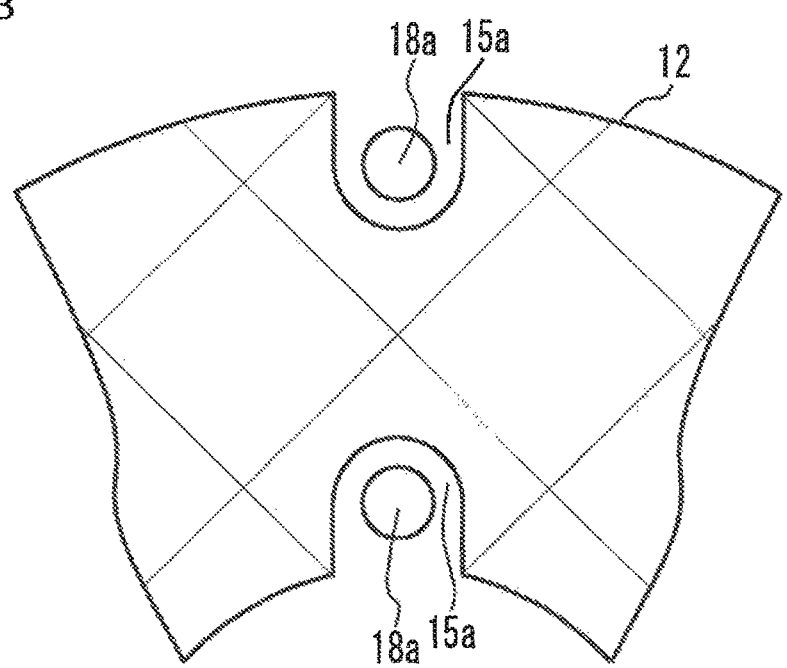
FIG. 10B is an enlarged view of a wiring line 12 around a supporting post 18.

FIG. 10A is a plan view of an inductor in accordance with a second variation of the first embodiment, and FIG. 10B is an enlarged view of the wiring line 12 around the supporting post 18. As illustrated in FIG. 10A and FIG. 10B, a cutout 15a is provided to each of the outer periphery and the inner periphery of the wiring line 12. The cutout 15a is a region where the wiring line 12 is formed such that the width of the wiring line 12 narrows in the region where the wiring line 14 and the substrate 10 overlap (i.e., a region that is surrounded by the wiring line 12 and is opened and is not closed in at least one direction). The supporting post 18 is located within the cutout 15a. Other structures are the same as those of the first embodiment, and the description thereof is thus omitted.

As in the second variation of the first embodiment, the supporting post 18 may be located within the cutout 15a of the wiring line 12. It is sufficient if the cutout 15a is provided to at least one of the outer periphery and the inner periphery of the wiring line 12. A plurality of the cutouts 15a and a plurality of the supporting posts 18 may be provided in the circumferential direction of the wiring line 14.

Third Variation of the First Embodiment

Figure 11A:
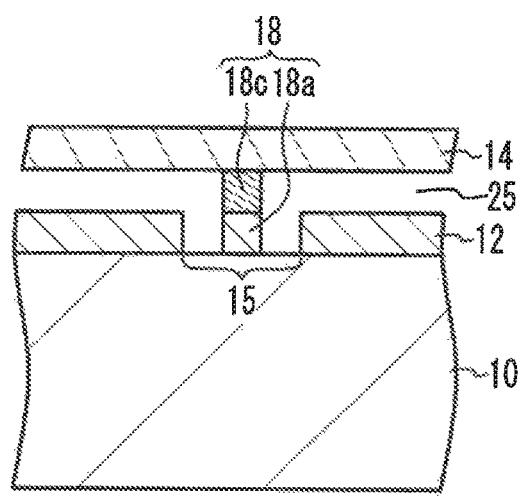
FIG. 11A through FIG. 11C are cross-sectional views of a part around the supporting post 18 of inductors in accordance with third through fifth variations of the first embodiment, respectively.
Figure 11B:
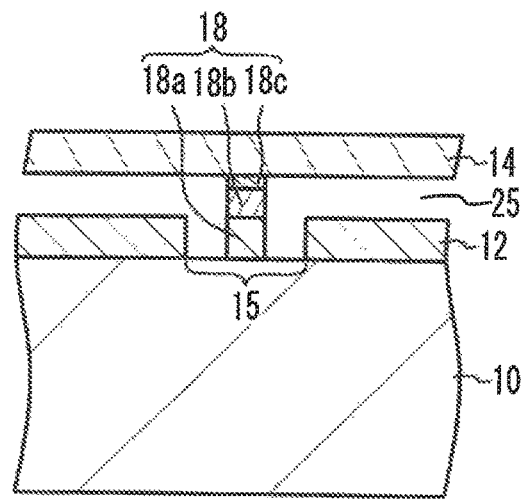
Figure 11C:
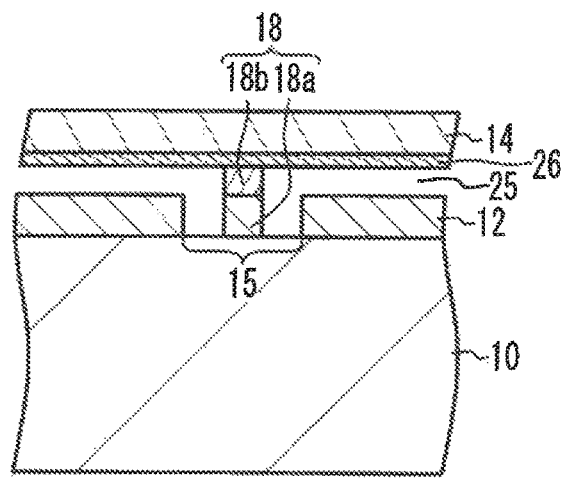

FIG. 11A through FIG. 11C are cross-sectional views of a part around the supporting post 18 of inductors in accordance with third through fifth variations of the first embodiment, respectively. As illustrated in FIG. 11A, in the third variation of the first embodiment, an insulating layer 18c is provided instead of the metal layer 18b that is the metal layer 32 of the first embodiment. The supporting post 18 is formed of the metal layer 18a and the insulating layer 18c. Other structures are the same as those of the first embodiment, and the description thereof is thus omitted.

Fourth Variation of the First Embodiment

As illustrated in FIG. 11B, in the fourth variation of the first embodiment, the insulating layer 18c is located between the metal layer 18b and the wiring line 14. The supporting post 18 is formed of the metal layers 18a and 18b and the insulating layer 18c. Other structures are the same as those of the first embodiment, and the description thereof is thus omitted.

Fifth Variation of the First Embodiment

As illustrated in FIG. 11C, in the fifth variation of the first embodiment, an insulating film 26 is located across substantially the entire lower surface of the wiring line 14. The metal layer 18b is in contact with the lower surface of the insulating film 26. Other structures are the same as those of the first embodiment, and the description thereof is thus omitted. As described in the third through fifth variations of the first embodiment, at least a part of the supporting post 18 may be made of an insulating material.

Sixth Variation of the First Embodiment

Figure 12A:
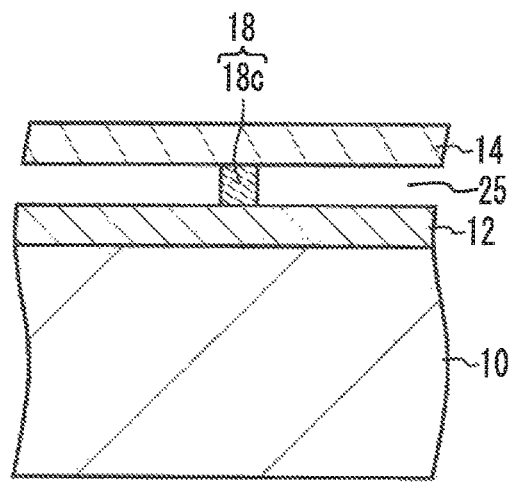
FIG. 12A through FIG. 12E are cross-sectional views of a part around the supporting post 18 of inductors in accordance with sixth through tenth variations of the first embodiment, respectively.

FIG. 12A through FIG. 12E are cross-sectional views of a part around the supporting post 18 of inductors in accordance with sixth through tenth variations of the first embodiment, respectively. As illustrated in FIG. 12A, in the sixth variation of the first embodiment, no opening 15 and no cutout 15a are provided to the wiring line 12. In plan view, the supporting post 18 overlaps with the wiring line 12. The supporting post 18 is formed of the insulating layer 18c located on the wiring line 12. Other structures are the same as those of the first embodiment, and the description thereof is thus omitted.

Seventh Variation of the First Embodiment

Figure 12B:
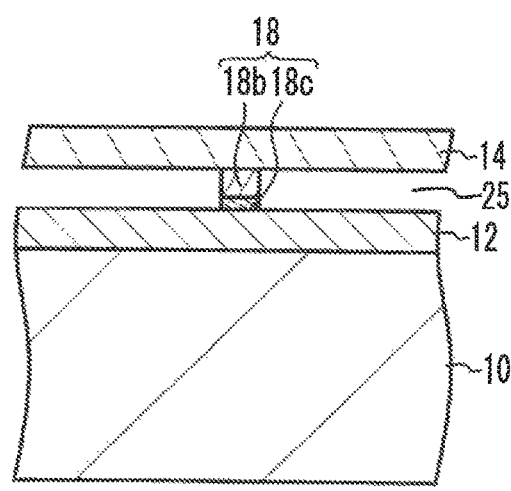

As illustrated in FIG. 12B, in the seventh variation of the first embodiment, the insulating layer 18c is located on the wiring line 12, and the metal layer 18b is located on the insulating layer 18c. The supporting post 18 is formed of the insulating layer 18c and the metal layer 18b. Other structures are the same as those of the sixth variation of the first embodiment, and the description thereof is thus omitted.

Eighth Variation of the First Embodiment

Figure 12C:
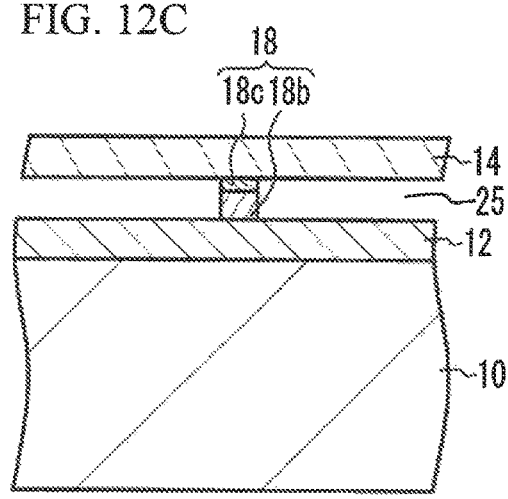

As illustrated in FIG. 12C, in the eighth variation of the first embodiment, the metal layer 18b is located on the wiring line 12, and the insulating layer 18c is located on the metal layer 18b. The supporting post 18 is formed of the insulating layer 18c and the metal layer 18b. Other structures are the same as those of the sixth variation of the first embodiment, and the description thereof is thus omitted.

Ninth Variation of the First Embodiment

Figure 12D:
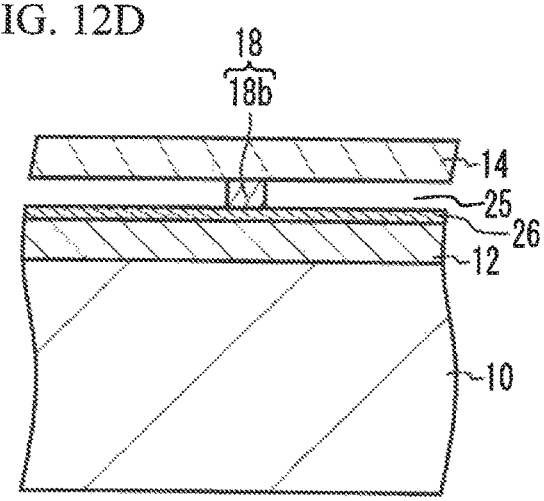

As illustrated in FIG. 12D, in the ninth variation of the first embodiment, the insulating film 26 is located across substantially the entire upper surface of the wiring line 12. The metal layer 18b is located on the insulating film 26. The supporting post 18 is formed of the metal layer 18b. Other structures are the same as those of the sixth variation of the first embodiment, and the description thereof is thus omitted.

Tenth Variation of the First Embodiment

Figure 12E:
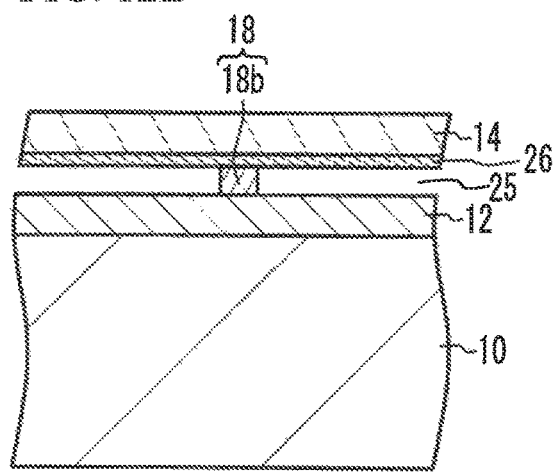

As illustrated in FIG. 12E, in the tenth variation of the first embodiment, the insulating film 26 is located across substantially the entire lower surface of the wiring line 14. The metal layer 18b is located on the wiring line 12, and is in contact with the lower surface of the insulating film 26. The supporting post 18 is formed of the metal layer 18b. Other structures are the same as those of the sixth variation of the first embodiment, and the description thereof is thus omitted.

As descried in the sixth through tenth variations of the first embodiment, no opening 15 and no cutout 15a may be provided to the wiring line 12, and the supporting post 18 may be located between the wiring lines 12 and 14. In this case, when the supporting post 18 is entirely made of metal, the wiring lines 12 and 14 are electrically connected. Thus, the insulating layer 18c is provided to at least a part of the supporting post 18, or the insulating film 26 is located on the upper surface of the wiring line 12 or the lower surface of the wiring line 14. This structure inhibits the wiring lines 12 and 14 from being electrically connected.

In the third through tenth variations of the first embodiment, the insulating layer 18c and the insulating film 26 are, for example, inorganic insulating films such as, but not limited to, silicon oxide films, silicon nitride films, or aluminum oxide films, or resin films (organic insulating films) such as, but not limited to, polyimide films or benzocyclobutene (BCB) films. The supporting post 18 of any one of the third through tenth variations of the first embodiment may be applied to the first and second variations of the first embodiment.

In the first embodiment and the variations thereof, the wiring line 12 (a first wiring line) is located on the substrate 10. The wiring line 14 (a second wiring line) is located above the wiring line 12, and is spaced from the wiring line 12 through the air gap 25, and at least a part of the wiring line 14 overlaps with at least a part of the wiring line 12 in plan view. The supporting post 16 (a first supporting post) connects the end of the wiring line 12 and the end of the wiring line 14 such that a direct current conducts between the wiring line 12 and the wiring line 14 through the supporting post 16. In the above described structure, the supporting post 18 (a second supporting post) is provided such that the supporting post 18 overlaps with the wiring line 14 in plan view, and overlaps with the wiring line 12 in plan view or is surrounded by the wiring line 12 in plan view. The supporting post 18 is insulated from the wiring line 12, and supports the wiring line 14.

As described above, when the supporting post 18 is provided further in than the inner periphery of the wiring line 12, it is not necessary to provide the extraction portion 13 unlike the second and third comparative examples and the first variations thereof, Thus, the inductor is reduced in size.

The wiring lines 12 and 14 have a coil shape surrounding the center region 52. Thus, the inductor can be formed by a simple structure. The inductor may be a solenoid coil or a toroidal coil.

In the first embodiment and the first variation thereof, the supporting post 18 does not overlap with the wiring line 12 in plan view, and is located in the opening 15 provided to the wiring line 12. This structure electrically insulates the supporting post 18 and the wiring line 12 from each other even when the supporting post 18 is conductive.

In the second variation of the first embodiment, the supporting post 18 does not overlap with the wiring line 12 in plan view, and is located in the cutout 15a provided to the wiring line 12. This structure electrically insulates the supporting post 18 and the wiring line 12 from each other even when the supporting post 18 is conductive.

It is sufficient if the dimension of the opening 15 and the dimension of the cutout 15a are less than D3 that is the width of the wiring line 12. Not to disturb the flow of current through the wiring line 12, the dimensions of the opening 15 and the cutout 15a in the current direction in which a current flows (the circumferential direction) and the direction perpendicular to the current direction (the radial direction) are preferably equal to or less than three-quarters of the width (D3) of the wiring line 12, more preferably equal to or less than one-half of the width (D3) of the wiring line 12, further preferably equal to or less than one-fifth of the width (D3) of the wiring line 12.

W1, which is the width of the supporting post 18, is preferably equal to or greater than one-half of the thickness T1 of the wiring line 12, more preferably 1 time the thickness T1 of the wiring line 12. This configuration enhances the mechanical strength and the impact resistance of the wiring line 14. W2, which is the interval between the supporting post 18 and the wiring line 12, is preferably equal to or greater than one-half of the thickness T1 of the wiring line 12, more preferably equal to or greater than 1 time the thickness T1 of the wiring line 12. This configuration insulates the supporting post 18 from the wiring line 12. The thickness T2 of the air gap 25 is preferably equal to or greater than one-half of the thickness T1 of the wiring line 12, more preferably equal to or greater than 1 time the thickness T1 of the wiring line 12. This configuration increases the Q-value.

As illustrated in FIG. 3A through FIG. 3C, the supporting post 18 includes the metal layers 18a and 18b. The metal layer 18a (a first metal layer) is located on the substrate 10, is made of a material substantially identical to the material of the metal layer 30 forming the wiring line 12, and has a thickness substantially identical to the thickness of the metal layer 30 forming the wiring line 12. The metal layer 18b (a second metal layer) is located on the metal layer 18a, is made of a material substantially identical to the material of the metal layer 32 forming the supporting post 17, and has a thickness substantially identical to the thickness of the metal layer 32 forming the supporting post 17.

Thus, the metal layer 18a can be formed at the same time as the wiring line 12, and the metal layer 18b can be formed at the same time as the supporting post 17. Thus, the manufacturing process is simplified. In the case where the supporting post 18 is formed of the metal layers 18a and 18b, when the supporting post 18 is provided further out than the outer peripheries of the wiring lines 12 and 14 or further in than the inner peripheries of the wiring lines 12 and 14 as in the second and third comparative examples and the first variation thereof, the Q-value decreases because of the eddy-current loss. Thus, the opening 15 or the cutout 15a is provided to the wiring line 12, and the supporting post 18 is provided in the opening 15 and the cutout 15a. This structure inhibits the decrease in the Q-value due to the eddy-current loss.

As described in the sixth through eighth variations of the first embodiment, the supporting post 18 may overlap with the wiring line 12 in plan view. This structure inhibits the opening 15 and the cutout 15a from disturbing the current flowing through the wiring line 12. However, the supporting post 18 is located between the wiring lines 12 and 14. Thus, when the supporting post 18 is entirely made of metal, the wiring lines 12 and 14 are electrically short-circuited. Thus, at least a part of the supporting post 18 is made of an insulating material. This structure inhibits the electric short circuit between the wiring lines 12 and 14.

In the ninth and tenth variations of the first embodiment, even when the supporting post 18 is entirely made of metal, the insulating film 26 is provided between the wiring line 12 and the supporting post 18 and/or between the wiring line 14 and the supporting post 18. This structure inhibits the electric short circuit between the wiring lines 12 and 14.

In the case where at least a part of the supporting post 18 is made of metal, when the supporting post 18 is located outside the wiring lines 12 and 14 as in the second and third comparative examples and the first variations thereof, the Q-value decreases because of the eddy-current loss. Thus, the supporting post 18 is provided such that the supporting post 18 overlaps with the wiring line 14, and overlaps with the wiring line 12 or is surrounded by the wiring line 12. This structure decreases the magnetic flux density in the region where the supporting post 18 is located, and reduces the eddy-current loss. Thus, the Q-value is increased.

In the first embodiment and the variations thereof, the number of turns of the coil 11 is 1.5, but the number of turns of the coil 11 may be greater than 1.5. When the number of turns is 2 or greater, the number of turns of at least one of the wiring lines 12 and 14 is greater than 1. In this case, the wiring lines 12 and 14 can be made to have a spiral shape.

Second Embodiment

Figure 13A:
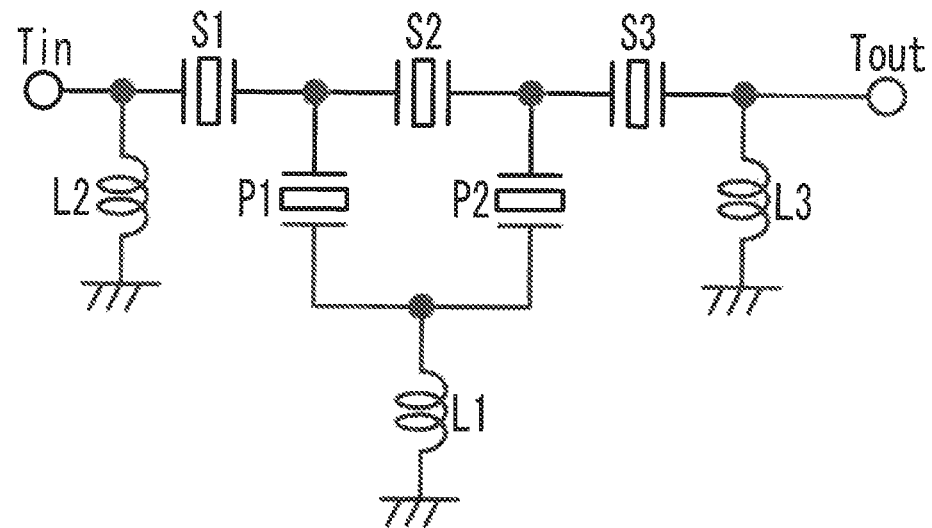
FIG. 13A is a circuit diagram of a filter in accordance with a second embodiment.

A second embodiment is an exemplary filter and an exemplary duplexer including the inductor according to any one of the first embodiment and the variations thereof. FIG. 13A is a circuit diagram of a filter in accordance with a second embodiment. As illustrated in FIG. 13A, one or more series resonators S1 through S3 are connected in series between an input terminal Tin and an output terminal Tout. One or more parallel resonators P1 and P2 are connected in parallel between the input terminal Tin and the output terminal Tout. One or more series resonators S1 through S3 and one or more parallel resonators P1 and P2 are acoustic wave resonators such as, but not limited to, piezoelectric thin film resonators or surface acoustic wave resonators.

An inductor L1 is connected between the parallel resonators P1 and P2 and a ground. An inductor L2 is connected between the input terminal Tin and a ground. An inductor L3 is connected between the output terminal Tout and a ground. The inductor L1 is an inductor for forming an attenuation pole. The inductors L2 and L3 are inductors for impedance matching. The inductor according to any one of the first embodiment and the variations thereof can be used as at least one of the inductors L1 through L3. A ladder-type filter is described as an example of the filter, and the number of resonators in the ladder-type filter is freely selected. The filter may be a multimode type filter.

Figure 13B:
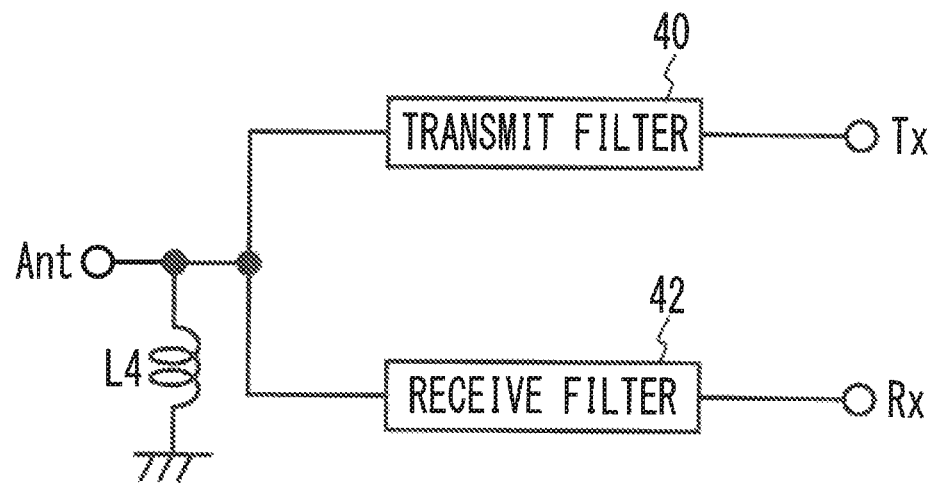
FIG. 13B is a circuit diagram of a duplexer in accordance with a first variation of the second embodiment.

FIG. 13B is a circuit diagram of a duplexer in accordance with a first variation of the second embodiment. As illustrated in FIG. 13B, a transmit filter 40 is connected between a common terminal Ant and a transmit terminal Tx. A receive filter 42 is connected between the common terminal Ant and a receive terminal Rx. The transmit filter 40 transmits, as transmission signals, signals in the transmit band to the common terminal Ant among high-frequency signals input from the transmit terminal Tx, and suppresses signals with other frequencies. The receive filter 42 transmits, as reception signals, signals in the receive band to the receive terminal Rx among high-frequency signals input from the common terminal Ant, and suppresses signals with other frequencies. An inductor L4 is connected between the common terminal Ant and a ground. The inductor L4 functions as a matching circuit.

The inductor according to any one of the first embodiment and the variations thereof can be used as the inductor L4. In addition, at least one of the transmit filter 40 and the receive filter 42 may be the filter of the second embodiment. A duplexer is described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. An inductor comprising:
a substrate;
a first wiring line located on the substrate;
a second wiring line located above the first wiring line and spaced from the first wiring line through an air gap, at least a part of the second wiring line overlapping with at least a part of the first wiring line in plan view;
a first supporting post connecting an end of the first wiring line and an end of the second wiring line such that a direct current conducts between the first wiring line and the second wiring line through the first supporting post; and
a second supporting post which overlaps with the second wiring line in plan view, and is surrounded by the first wiring line in plan view, the second supporting post being insulated from the first wiring line, the second supporting post supporting the second wiring line, wherein
the second supporting post does not overlap with the first wiring line in plan view, and is located in an opening, and
the first wiring line has the opening and the opening is a closed area completely surrounded by the first wiring line.

2. The inductor according to claim 1, wherein
the first wiring line and the second wiring line have a coil shape surrounding a center region.

3. The inductor according to claim 1, wherein
a dimension of the opening is equal to or less than three-quarters of a width of the first wiring line.

4. An inductor comprising:
a substrate;
a first wiring line located on the substrate;
a second wiring line located above the first wiring line and spaced from the first wiring line through an air gap, at least a part of the second wiring line overlapping with at least a part of the first wiring line in plan view;
a first supporting post connecting an end of the first wiring line and an end of the second wiring line such that a direct current conducts between the first wiring line and the second wiring line through the first supporting post; and
a second supporting post which overlaps with the second wiring line in plan view, and is surrounded by the first wiring line in plan view, the second supporting post being insulated from the first wiring line, the second supporting post supporting the second wiring line, wherein
the second supporting post does not overlap with the first wiring line in plan view, and is located in a cutout, and
the first wiring line has the cutout and the cutout is a recessed area on an outer circumference of the first wiring line.

5. The inductor according to claim 1, wherein
the second supporting post includes a first metal layer located on the substrate and a second metal layer located on the first metal layer, the first metal layer being made of a material substantially identical to a material of a metal layer forming the first wiring line, and having a thickness substantially identical to a thickness of the metal layer forming the first wiring line, the second metal layer being made of a material substantially identical to a material of a metal layer forming the first supporting post, and having a thickness substantially identical to a thickness of the metal layer forming the first supporting post.

6. An inductor comprising:
a substrate;
a first wiring line located on the substrate;
a second wiring line located above the first wiring line and spaced from the first wiring line through an air gap, at least a part of the second wiring line overlapping with at least a part of the first wiring line in plan view;
a first supporting post connecting an end of the first wiring line and an end of the second wiring line such that a direct current conducts between the first wiring line and the second wiring line through the first supporting post; and
a second supporting post which overlaps with the second wiring line and the first wiring line in plan view, the second supporting post being insulated from the first wiring line, the second supporting post supporting the second wiring line, wherein
the second supporting post mechanically connects between the wiring line and the second wiring line and does not electrically connect the first wiring line and the second wiring line, and at least a part of the second supporting post is made of an insulating material.

7. The inductor according to claim 6, further comprising:
an insulating film located between the first wiring line and the second supporting post and/or between the second wiring line and the second supporting post, wherein
at least a part of the second supporting post is made of metal.

8. The inductor according to claim 1, wherein
at least a part of the second supporting post is made of metal.

9. A filter comprising:
the inductor according to claim 1.

10. A multiplexer comprising:
the according to claim 1.

11. The inductor according to claim 4, wherein
the first wiring line and the second wiring line have a coil shape surrounding a center region.

12. The inductor according to claim 6, wherein
the first wiring line and the second wiring line have a coil shape surrounding a center region.

13. The inductor according to claim 4, wherein
the second supporting post includes a first metal layer located on the substrate and a second metal layer located on the first metal layer, the first metal layer being made of a material substantially identical to a material of a metal layer forming the first wiring line, and having a thickness substantially identical to a thickness of the metal layer forming the first wiring line, the second metal layer being made of a material substantially identical to a material of a metal layer forming the first supporting post, and having a thickness substantially identical to a thickness of the metal layer forming the first supporting post.

14. A filter comprising:
the inductor according to claim 4.

15. A multiplexer comprising:
the inductor according to claim 4.

16. A filter comprising:
the inductor according to claim 6.

17. A multiplexer comprising:
the inductor according to claim 6.

* * * * *